United States Patent [19]

Watanabe

[11] Patent Number: 4,727,554
[45] Date of Patent: Feb. 23, 1988

[54] TEMPERATURE CONTROLLER FOR SEMICONDUCTOR DEVICES

[75] Inventor: Hideo Watanabe, Kaisei, Japan

[73] Assignee: Fuji Photo Film Co., Ltd., Japan

[21] Appl. No.: 827,889

[22] Filed: Feb. 10, 1986

[30] Foreign Application Priority Data

Feb. 18, 1985 [JP] Japan .................................. 60-30117

[51] Int. Cl.⁴ ..................... H01L 23/38; H01L 33/00; H01S 3/19; H01S 3/04
[52] U.S. Cl. ........................................ 372/36; 372/34; 357/28; 357/87; 357/81; 361/386
[58] Field of Search ............................. 357/28, 87, 81; 361/140, 381, 386, 383, 388; 372/36, 34

[56] References Cited

U.S. PATENT DOCUMENTS

| | | | |
|---|---|---|---|
| 4,403,243 | 9/1983 | Hakamaoa | 357/30 |
| 4,454,602 | 6/1984 | Smith | 357/81 |
| 4,571,728 | 2/1986 | Yoshikawa | 357/87 |
| 4,604,753 | 8/1986 | Sawai | 357/81 |

FOREIGN PATENT DOCUMENTS 59-204292  11/1984  Japan ..................................... 372/34

Primary Examiner—William D. Larkins
Assistant Examiner—John Lamont
Attorney, Agent, or Firm—Gerald J. Ferguson, Jr.; Michael P. Hoffman; Michael J. Foycik, Jr.

[57] ABSTRACT

A temperature controller includes a block-shaped heat sink in which a plurality of semiconductor devices to be controlled are mounted, a temperature sensor mounted in the heat sink, and a temperature controlling element mounted on the heat sink. The temperature sensor detects the temperature of the semiconductor devices through the heat sink, and the temperature controlling element responds to an output signal from the temperature sensor for controlling the temperature of the semiconductor devices through the heat sink so that the temperature will be substantially constant. Therefore, the semiconductor devices can be simultaneously controlled in temperature through the single temperature sensor and the single temperature controlling element.

8 Claims, 3 Drawing Figures

TEMPERATURE CONTROLLER FOR SEMICONDUCTOR DEVICES

BACKGROUND OF THE INVENTION

1. Field of the Invention

The present invention relates to a temperature controller for semiconductor devices, and more particularly to a temperature controller capable of accurately and simply controlling the temperature of a plurality of semiconductor devices.

1. Description of the Prior Art

As is well known in the art, semiconductor devices are widely used in various electronic components and devices such as transistors, integrated circuits, and the like. Many light beam scanners such as scanning recorders and scanning readers for deflecting and scanning a light beam with a light beam deflector employ semiconductor lasers as means for emitting such a scanning light beam.

In some applications, a plurality of semiconductor devices are used in combination to meet certain requirements. Specifically, a single continuous wave semiconductor laser which is available for use in light beam scanners has a power output ranging from at most 20 to 30 mW. Since the output energy generated by such a single continuous wave semiconductor laser is too small for a light beam scanner which requires a scanning light beam of high energy, a plurality of such semiconductor lasers of low energy output may be used in combination in a light beam scanner, and the laser beams emitted from the respective semiconductor lasers may be combined into a single laser beam for scanning a desired surface.

The semiconductor devices are highly temperature-dependent. It is necessary to effect highly accurate temperature control on certain semiconductor devices such as a semiconductor laser which must be as free as possible from output power changes dependent on temperature variations. Where a plurality of semiconductor devices are combined for an increased power output, it is desired that the temperature of all of the semiconductor devices be controlled highly accurately since even small errors in temperature control of the respective semiconductor devices would have a cumulative effect on the combined power output from the semiconductor devices. Since it would not be preferable in terms of cost to provide each of the semiconductor devices with means for effecting highly accurate temperature control, there has been a demand for a temperature controller for easily and inexpensively controlling the temperature of a plurality of combined semiconductor devices with high accuracy.

SUMMARY OF THE INVENTION

In view of the above demand, it is an object of the present invention to provide a temperature controller which can control the temperature of a plurality of semiconductor devices highly accurately and easily, and which can be manufactured at a low cost.

According to the present invention, a temperature controller for semiconductor devices includes a block-shaped heat sink in which the semiconductor devices are mounted, a temperature sensor mounted in the heat sink, and a temperature controlling element mounted on the heat sink. The temperature sensor detects the temperature of the semiconductor devices through the heat sink, and the temperature controlling element responds to an output signal from the temperature sensor for controlling the temperature of the semiconductor devices through the heat sink so that the temperature will be substantially constant. Therefore, the semiconductor devices can be simultaneously controlled in temperature through the single temperature sensor and the single temperature controlling element.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
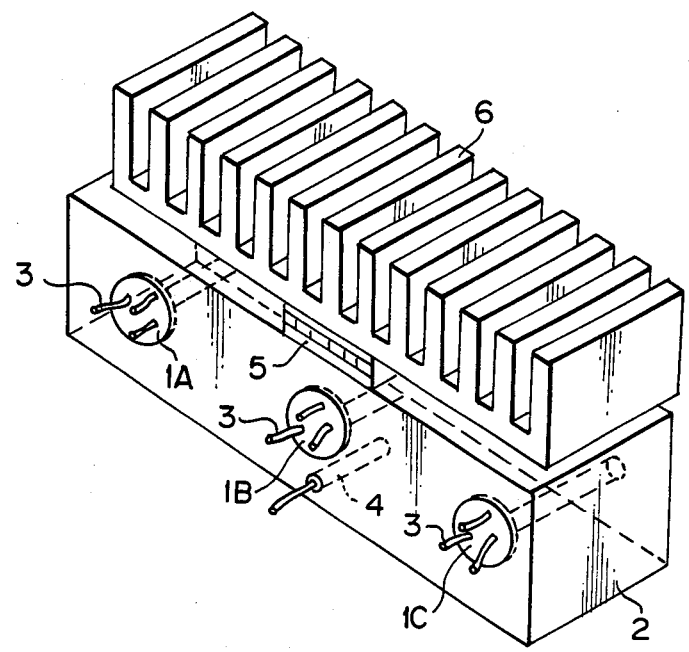
FIG. 1 is a perspective view of a temperature controller for semiconductor devices according to an embodiment of the present invention.

As shown in FIG. 1, three (for example) semiconductor devices 1A, 1B, 1C such as semiconductor lasers are mounted in spaced relation as a horizontal array longitudinally in a block-shaped elongate heat sink 2 made of a material of high thermal conductivity. The semiconductor devices 1A, 1B, 1C can be energized by electric currents supplied over leads 3 connected respectively thereto. A temperature sensor 4 such as a thermistor is disposed in the heat sink 2 below the central semiconductor device 1B for detecting the temperature of the semiconductor devices through the heat sink 2. An electronic cooling device 5 such as a Peltier-effect device which serves as a temperature controlling element is disposed centrally on the upper surface of the heat sink 2. When the temperature of the semiconductor devices 1A, 1B, 1C rises beyond a predetermined temperature, the semiconductor devices 1A, 1B 1C are cooled by the electronic cooling device 5 through the heat sink 2. A heat-radiating fin 6 is mounted on the electronic cooling device 5 for effectively radiating the heat transmitted from the semiconductor devices 1A, 1B, 1C through the heat sink 2 to the electronic cooling device 5 and then to the heat-radiating fin 6.

Figure 2:
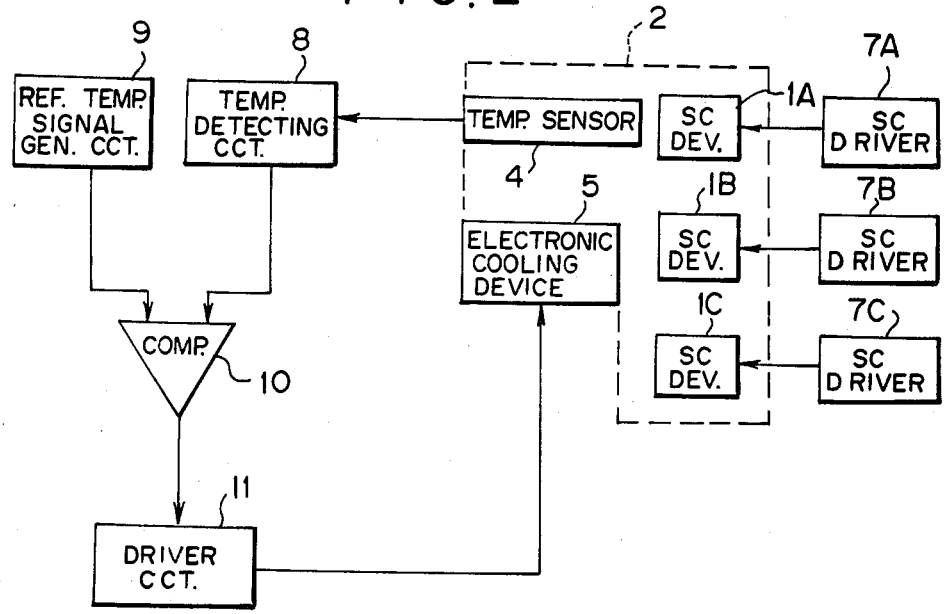
FIG. 2 is a block diagram of the temperature controller connected to control the temperature of the semiconductor devices.

Operation of the temperature sensor 4 and the electronic cooling device 5 will be described in greater detail with reference to FIG. 2.

When the semiconductor devices 1A, 1B, 1C are supplied with electric currents from the respective semiconductor device driver circuits 7A, 7B, 7C, the semiconductor devices 1A, 1B, 1C are energized. The temperature sensor 4 continuously detects the temperature of the semiconductor devices 1A, 1B, 1C in operation through the heat sink 2, and delivers a signal representing the detected temperature to a temperature detecting circuit 8. The temperature detecting circuit 8 responds to the signal from the temperature sensor 4 and produces a temperature signal which is applied to a comparator 10. The comparator 10 then compares the applied temperature signal with a predetermined reference temperature signal from a reference temperature signal generating circuit 9. If the temperature of the semiconductor devices 1A, 1B, 1C as indicated by the temperature signal is higher than a desired temperature for the semiconductor devices, as represented by the reference temperature signal, then the comparator 10 issues a signal for energizing a temperature controlling element driver circuit 11. The driver circuit 11 is therefore energized to drive the electronic cooling device 5 for simultaneously cooling the semiconductor devices 1A, 1B, 1C through the heat sink 2. When the temperature of the semiconductor devices 1A, 1B, 1C is lowered to the predetermined desired temperature, the comparator 10 stops generating the signal, thus de-energizing the electronic cooling device 5.

The temperature of the semiconductor devices 1A, 1B, 1C is therefore controlled by the single temperature sensor and the single temperature controlling element. Accordingly, the temperature of a plurality of semiconductor devices can be controlled simply and with high accuracy by an inexpensive temperature controller, and a control circuit required for temperature control is quite simple in arrangement.

Figure 3:
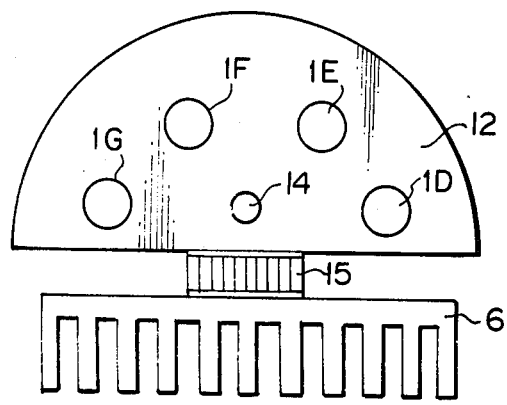
FIG. 3 is a front elevational view of a temperature controller according to another embodiment of the present invention.

In the embodiment of FIG. 1, the semiconductor devices 1A, 1B, 1C are spaced from the electronic cooling device 5 by different distances, and the temperature of the semiconductor devices 1A, 1C positioned in the ends of the heat sink 2 farther from the electronic cooling device 5 cannot be controlled as effectively as the temperature of the central semiconductor device 1B located centrally in the heat sink 2 more closely to the electronic cooling device 5. FIG. 3 shows a temperature controller according to another embodiment which is arranged to avoid such a drawback. In FIG. 3, semiconductor devices 1D, 1E, 1F, 1G are mounted in a semicylindrical heat sink 12 in angularly spaced relation as a semicircular array such that they are equidistant from an electronic cooling device 15 disposed at the center of the semicircular array pattern. A temperature sensor 14 is also positioned so as to be equally spaced from the semiconductor devices 1D, 1E, 1F, 1G.

Depending on the characteristics of the semiconductor devices used and the environment in which they are used, the temperature controlling element may be a heater disposed on the heat sink, rather than the cooling device. Where a heater is employed, the heat-radiating fin 6 may be dispensed with. The cooling device for cooling the semiconductor devices is not limited to the electronic cooling device, but may be of a different design. A Peltier-effect device used as the electronic cooling device absorbs heat when an electric current is passed in one direction, and produces heat when an electric current is passed in the reverse direction. By controlling the Peltier-effect device so that it can double as both an electronic cooling and a heating device, the temperature of the semiconductor devices can be controlled when they are heated and cooled excessively. The number and pattern of arrangement of semiconductor devices to be controlled, and the configuration of the heat sink are not limited to those illustrated, but may be selected as desired.

According to the present invention, as described above, a plurality of semiconductors are mounted in a block-shaped heat sink, and their temperature is simultaneously controlled through the heat sink by a single temperature sensor and a single temperature controlling element. Therefore, the semiconductor devices can be controlled simply and highly accurately by a temperature controller arrangement which is inexpensive to manufacture.

Although certain preferred embodiments have been shown and described, it should be understood that many changes and modifications may be made therein without departing from the scope of the appended claims.

I claim:

1. A temperature controller for controlling the temperature of a plurality of semiconductor devices, comprising:
   (i) a block-shaped heat sink in which the semiconductor devices are mounted, said semiconductor devices being arranged in spaced relation as a straight array in said heat sink:
   (ii) a temperature sensor mounted in said heat sink; and
   (iii) a temperature controlling device mounted on said heat sink and responsive to an output signal from said temperature sensor for controlling the temperature of the semiconductor devices so that the temperature will be substantially constant, wherein said temperature sensor and said temperature controlling element are positioned more closely to one of said semiconductor devices than the remaining semiconductor devices.

2. A temperature controller according to claim 1 wherein said block-shaped heat sink is of an elongate shape with said straight array extending longitudinally in said block-shaped heat sink.

3. A temperature controller according to claim 1, further comprising a heat-radiating fin mounted on said temperature controlling device.

4. A temperature controller according to claim 1, wherein said temperature controlling device comprises a Peltier-effect device.

5. A temperature controller for controlling the temperature of a plurality of semiconductor devices, comprising:
   (i) a block-shaped heat sink in which the semiconductor devices are mounted;
   (ii) a temperature sensor mounted in said heat sink; and
   (iii) a temperature controlling device mounted on said heat sink and responsive to an output signal from said temperature signal for controlling the temperature of the semiconductor devices so that the temperature will be substantially constant, wherein said temperature sensor and said temperature controlling device are positioned in equidistant relation to each of said semiconductor devices.

6. A temperature controller according to claim 5, further comprising a heat-radiating fin mounted on said temperature controlling device.

7. A temperature controller according to claim 5, wherein said temperature controlling device comprises a Peltier-effect device.

8. A temperature controller according to claim 5, wherein said block-shaped heat sink is of a semicylindrical shape, said semiconductor devices being arranged as a semicircular array with said temperature controlling device being positioned at the center of the semicircular array.

* * * * *